United States Patent [19]
Hshieh et al.

[11] Patent Number: 5,750,416
[45] Date of Patent: May 12, 1998

[54] METHOD OF FORMING A LATERAL FIELD EFFECT TRANSISTOR HAVING REDUCED DRAIN-TO-SOURCE ON-RESISTANCE

[75] Inventors: Fwu-Iuan Hshieh, Saratoga; Mike F. Chang, Cupertino; Jan Van der Linde, Saratoga; Yueh-Se Ho, Sunnyvale, all of Calif.

[73] Assignee: Siliconix Incorporated, Santa Clara, Calif.

[21] Appl. No.: 479,308

[22] Filed: Jun. 7, 1995

Related U.S. Application Data

[62] Division of Ser. No. 418,397, Apr. 7, 1995.
[51] Int. Cl.$^6$ ................................................ H01L 21/265
[52] U.S. Cl. .......................... 437/40 AS; 437/40 DM; 437/41 DM; 437/6; 148/DIG. 126
[58] Field of Search ................ 437/40 DM, 41 DM, 437/6, 150, 152, 911, 40 AS, 41 AS; 148/DIG. 126; 257/328, 335, 339, 341

[56] References Cited

U.S. PATENT DOCUMENTS 5,442,219  8/1995  Kato ............................... 257/328
5,451,797  9/1995  Davis et al. ...................... 257/77

OTHER PUBLICATIONS

Yoshida et al., "A High Power MOSFET with a Vertical Drain Electrode and a Meshed Gate Structure", IEEE Jour. of Solid–State Circuits, vol. SC–11, No. 4, Aug. 1976, pp. 472–477.

Morita et al., "Si UHF MOS High–Power FET", IEEE Trans. on Electron Devices, pp. 733–734, Nov. 1974.

*Primary Examiner*—Tuan H. Nguyen
*Attorney, Agent, or Firm*—Skjerven Morrill MacPherson Franklin & Friel; Norman R. Klivans

[57] ABSTRACT

A power field effect transistor has a laterally extending channel region which is not formed by double diffusion. The channel region may be formed in epitaxial silicon which is not doped after being grown. The drain electrode of the transistor is disposed on a bottom surface of the substrate upon which the transistor structure is formed. When the transistor is turned on, the channel region inverts thereby forming a conductive path from a source region, laterally through the inverted channel region, substantially vertically through a sinker region to the underlying substrate, through the substrate, and to the drain electrode.

6 Claims, 6 Drawing Sheets

5,750,416

METHOD OF FORMING A LATERAL FIELD EFFECT TRANSISTOR HAVING REDUCED DRAIN-TO-SOURCE ON-RESISTANCE

This application is a division of application Ser. No. 08/418,397, filed Apr. 7, 1995.

FIELD OF THE INVENTION

This invention relates to power field effect transistors.

BACKGROUND INFORMATION

FIG. 1 (Prior Art) is a simplified cross-sectional diagram of an N-channel power field effect transistor.

FIG. 2 (Prior Art) is a simplified top down view of the power field effect transistor of FIG. 1. The line AA in FIG. 2 indicates the location at which the cross-sectional diagram of FIG. 1 is taken. The gate and the gate pad are omitted for clarity of illustration.

When a positive voltage of adequate voltage is placed on the gate 1, a channel region 2 inverts. A conductive path is therefore established so that electrons can flow from a metal source pad 3, through metal source finger electrode and contact 4, through N+ source region 5, through channel region 2, through N+ drain region 6, through metal drain finger electrode and contact 7, and to metal drain electrode 8. The squares in FIG. 2 represent contact portions of the source and drain electrodes which extend down to the semiconductor surface and make contact with the semiconductor surface. The arrow in FIG. 1 illustrates the flow of electrons when the transistor is turned on.

A low drain-to-source on-resistance ($R_{DSon}$) is generally desired in a power transistor. The relatively small cross-sectional area of the contact portions of the drain and source electrodes therefore contributes to the drain-to-source resistance. The resistor symbols in FIG. 1 represent the resistance due to the contact portions of the drain and source electrodes. Moreover, electrons flowing through the portion of the channel region shown in FIG. 1 must flow through a significant length of a source finger electrode in order to get from the metal source pad 3 to the location of cross-sectional line AA and must flow through a significant length of a drain finger electrode in order to get from the location of cross-sectional line AA to the metal drain pad 8. The resistor symbols in FIG. 2 represent the resistance due to the finger electrodes. The lateral field effect transistor structure of FIGS. 1 and 2 therefore may have an undesirably high $R_{DSon}$.

FIG. 3 (Prior Art) is a simplified cross-sectional diagram of a double diffused metal oxide semiconductor (DMOS) power field effect transistor. An N− type epitaxial silicon layer 9 is formed on a N+ type substrate 10. The transistor structure includes a deep P+ body region 11A, a P body region 11B, an N+ type source region 12, a gate 13, a metal source electrode 14, and a metal drain electrode 15. (deep P+ body region 11A and P body region 11B are together called the "body region"). When an adequately positive voltage is placed on gate 13, a channel region 16 in the P body region 11B inverts. A conductive path is therefore formed from source electrode 14, through source region 12, through inverted channel region 16, downward through the N− epitaxial silicon between body regions, through substrate 10 and to drain electrode 15. The arrow in FIG. 3 illustrates the flow of electrons from the source electrode 14 to the drain electrode 15 when the transistor is turned on.

In a power transistor, it is generally desirable to have a repeatable and relatively high source-to-drain breakdown voltage. When a high source-to-drain voltage is present between the source and drain electrodes, and when the transistor is to be off, a depletion region forms at the boundary between the N-epitaxial silicon and the channel region 16. The greater the source-to-drain voltage, the more the depletion region expands. If the depletion region expands so far that it contacts the N+ source region 12, a conductive path is formed through the P body region 11B. This is called "punchthrough". Under such punchthrough conditions, a large current can flow through the depletion region resulting in early breakdown between the drain and the source.

A structure such as that of FIG. 3 may be susceptible to punchthrough problems. The portion of the P body region 11B which serves as the channel region is formed by what is called "double diffusion". The edge 17 of gate 13 is used to mask dopants when P type dopants are introduced into the upper surface of epitaxial silicon 9 to form the P body region 11B. These P type dopants are then diffused laterally underneath the gate 13 in a subsequent thermal diffusion step. Next, the edge 17 is used to introduce N type dopants into the upper surface of the epitaxial silicon to form the N+ type source region 12. The N type dopants are then diffused laterally underneath the gate 13 in a subsequent thermal diffusion step. The P type dopants of the P body region 11B are, however, also laterally diffused underneath the gate in this step. The difference in lateral diffusion gives rise to the narrow P type channel region of the P body region. Such differential lateral diffusion is, however, often somewhat difficult to control.

FIG. 4 illustrates the variability possible in the channel region along the dashed line BC in FIG. 3. The channel region may be more or less narrow as indicated by the symbol Δ1. Also, the channel region may be more or less heavily doped as indicated by the symbol Δ2. These variations may result in some transistors (or some parts of a transistor) not being able to tolerate an adequately high source-to-drain breakdown voltage.

A transistor structure is therefore desired which does not have the high $R_{DSon}$ associated with the structure of FIG. 1 and which also does not have the punchthrough problems associated with the structure of FIG. 3.

SUMMARY

To avoid punchthrough problems associated with channel regions formed by double diffusion, a power field effect transistor structure has a laterally extending channel region which is not formed by double diffusion. In some embodiments, the channel region is formed in epitaxial silicon which is not doped after being grown.

To avoid the resistance associated with long drain finger electrodes and/or the contacts of drain electrodes, the drain electrode of the transistor structure is disposed on a bottom surface of a substrate upon which the transistor structure is formed. When the transistor structure is turned on, the channel region inverts thereby forming a conductive path from a source region, laterally through the inverted channel region, substantially vertically through a sinker region to the underlying substrate, through the substrate, and to the drain electrode. In some embodiments, lightly doped drain and source regions are provided. Spacers are disclosed for forming such lightly doped regions. Methods for making transistor structures are also disclosed. This summary does not purport to define the invention. The invention is defined by the appended claims.

DETAILED DESCRIPTION OF THE PREFERRED EMBODIMENTS

Figure 1:
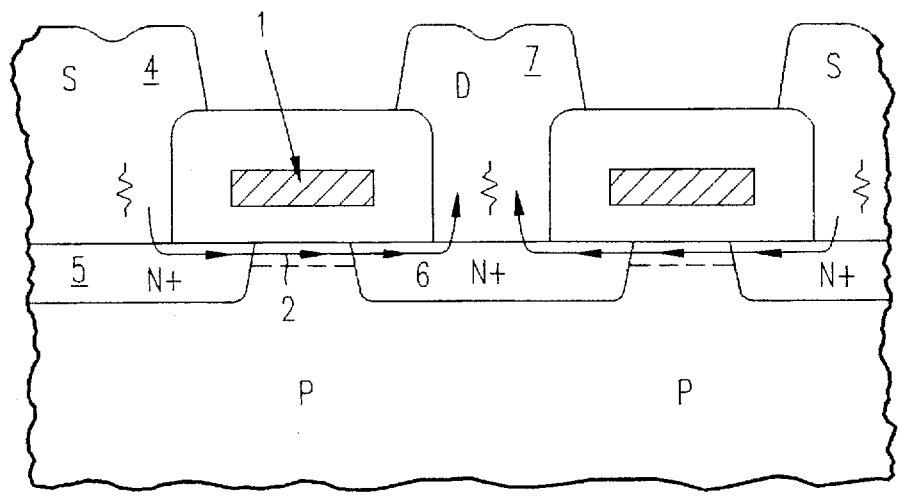
FIG. 1 (Prior Art) is a simplified cross-sectional diagram of an N-channel lateral power field effect transistor.
Figure 2:
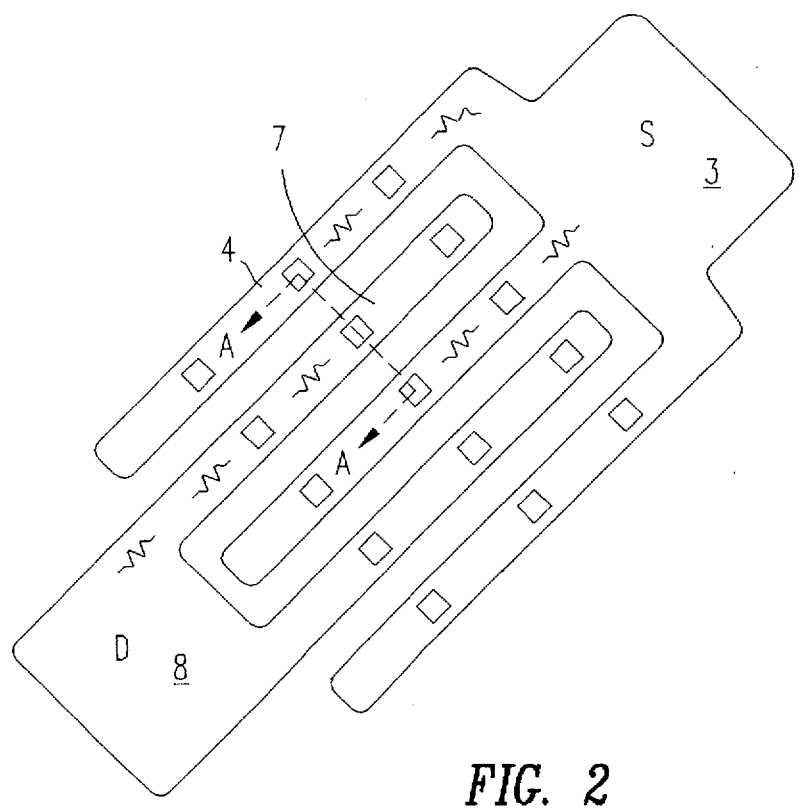
FIG. 2 (Prior Art) is a simplified top down view of the power field effect transistor of FIG. 1.
Figure 3:
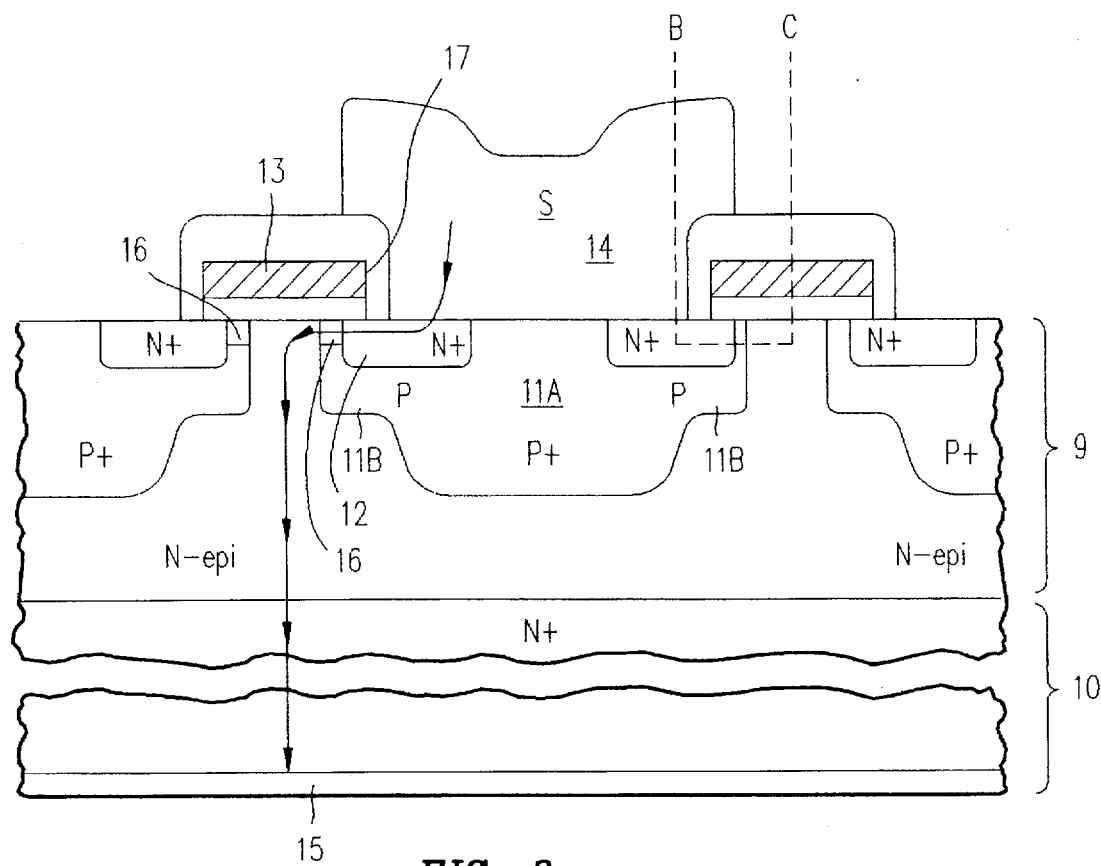
FIG. 3 (Prior Art) is a simplified cross-sectional diagram of a DMOS power field effect transistor.
Figure 4:
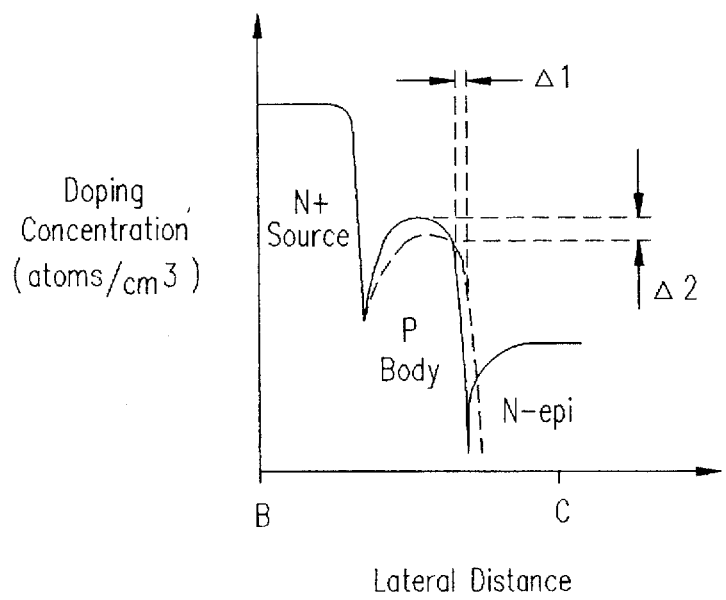
FIG. 4 illustrates the variability possible in the channel region of the DMOS transistor of FIG. 3.
Figure 5:
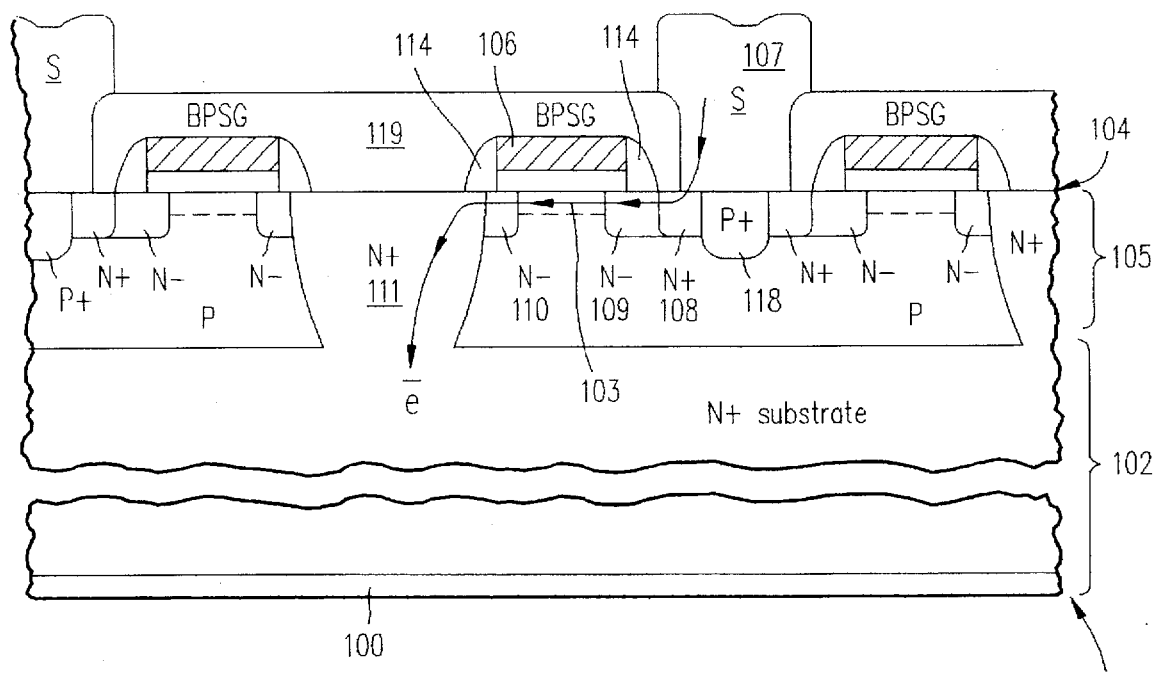
FIG. 5 is a simplified cross-sectional diagram of a transistor structure in accordance with an embodiment of the present invention.

FIG. 5 is a simplified cross-sectional diagram of an N-channel transistor structure in accordance with an embodiment of the present invention. To avoid the resistance associated with the drain finger electrode and the contact portions thereof, the drain electrode 100 is disposed on the bottom surface 101 of the substrate 102. To avoid the punchthrough problems associated with channel regions formed by double diffusion, the channel region 103 is disposed at the upper surface 104 of epitaxial silicon layer 105. When a voltage is placed on gate 106 such that the channel region 103 inverts, a conductive path is formed from metal source electrode 107, through N+ type source region 108, through N– type lightly doped source region 109, through inverted channel region 103, through N– type lightly doped drain region 110, through N+ type sinker region, through N+ type substrate layer 102, and to drain electrode 100.

FIGS. 6A–6E are cross-sectional diagrams illustrating a process of making the structure of FIG. 5. The dimensions and dopant concentrations presented below are descriptive of a specific embodiment. Other dimensions and concentrations are possible. Although the polysilicon features corresponding with gate 106 may be referred to as "gates" in this description, it is understood the such "gates" only appear as such in cross-section and are in reality two cross-sections of the same gate structure.

First, layer 105 of P type epitaxial silicon is grown on an upper surface of N+ type substrate 102. The P type epitaxial silicon can be grown having its P type dopants or can be grown and then subsequently doped. The N+ type substrate may have a resistivity of 1–5 mΩ-cm. Epitaxial layer 105 may be 0.5–1.5 microns thick.

Figure 6A:
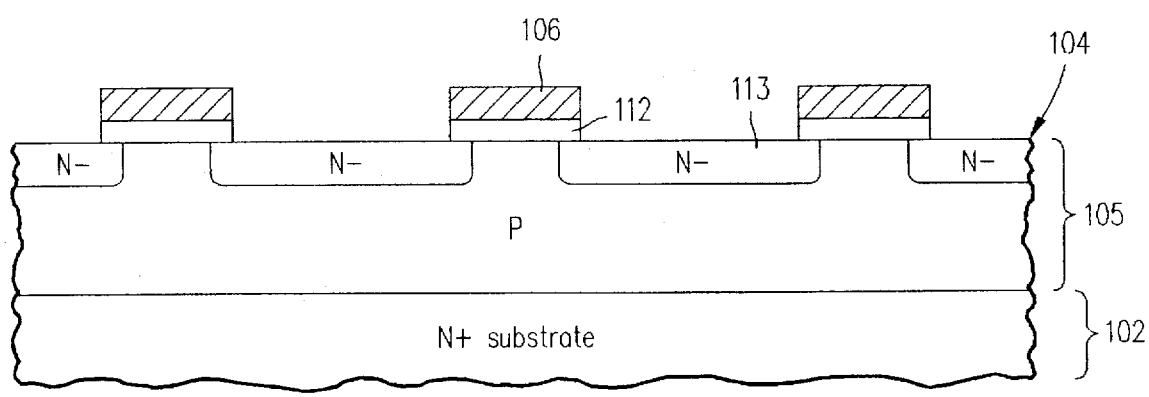
FIGS. 6A–6E are cross-sectional diagrams illustrating a process of making the structure of FIG. 5.

Next, a gate oxide layer is grown to a thickness of approximately 125–700 angstroms and a layer of polysilicon approximately 0.4–1.0 microns thick is deposited over the gate oxide layer. The polysilicon and oxide layers are then masked and etched to form gate 106 with underlying gate oxide 112. Gate 106 is approximately 1–2 microns wide. Using gate 106 as an implant mask, N– region 113 is implanted with a dose of 2–5E12 atoms/cm$^2$ into upper surface 104 of the epitaxial layer 105. After implanting, the N type dopants are diffused to a depth of approximately 0.15–0.5 microns in a thermal diffusion step. The resulting structure is shown in FIG. 6A.

Figure 6B:
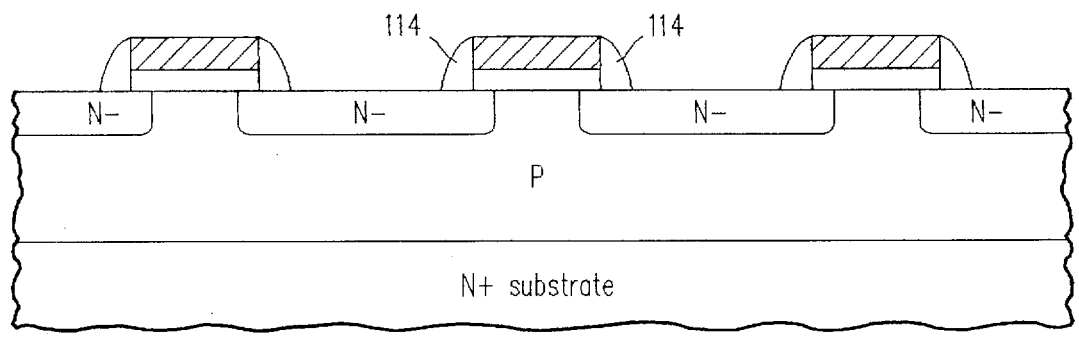

Next, a layer of oxide or nitride is formed over the structure and is reactive ion etched (RIE) to form oxide or nitride spacers 114. Oxide spacers 114 are approximately 0.3–1.0 microns wide at surface 104. The resulting structure is shown in FIG. 6B.

Figure 6C:
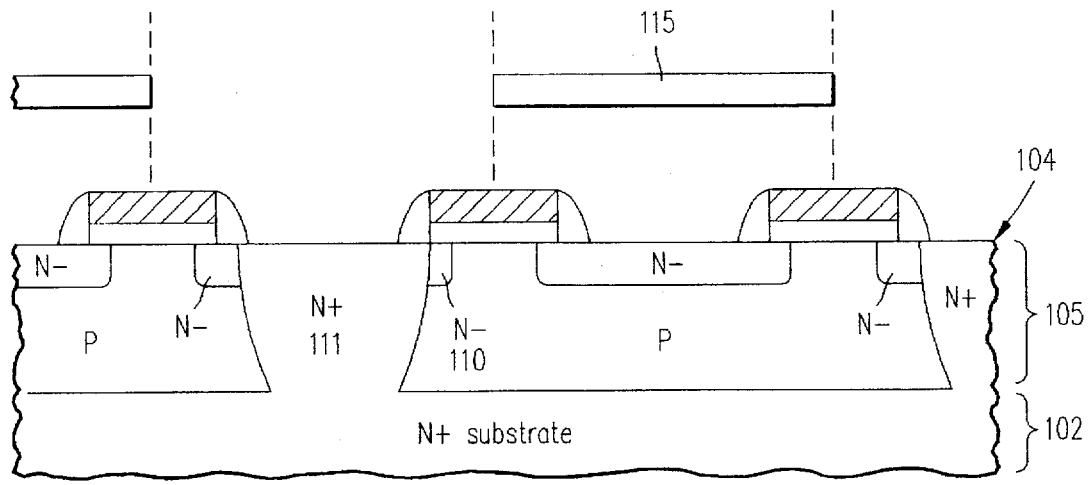

Next, a source region is masked using a source mask 115 represented in FIG. 6C by a rectangle. N type dopants are then implanted and diffused to form N+ type sinker region 111. Sinker region 111 extends through epitaxial layer 105 from upper surface 104 to substrate 102. Sinker region 111 has an approximate surface doping concentration of 4–6E19 atoms/cm$^3$. The distance between the adjacent gates over sinker region 111 at surface 104 is approximately 1–2 microns. The distance between the adjacent gates (over the source region at surface 104) is approximately 3–4 microns. Due to the lateral diffusion of the N– type source regions, a lightly doped drain region 110 is formed contacting sinker region 111 at upper surface 104.

Figure 6D:
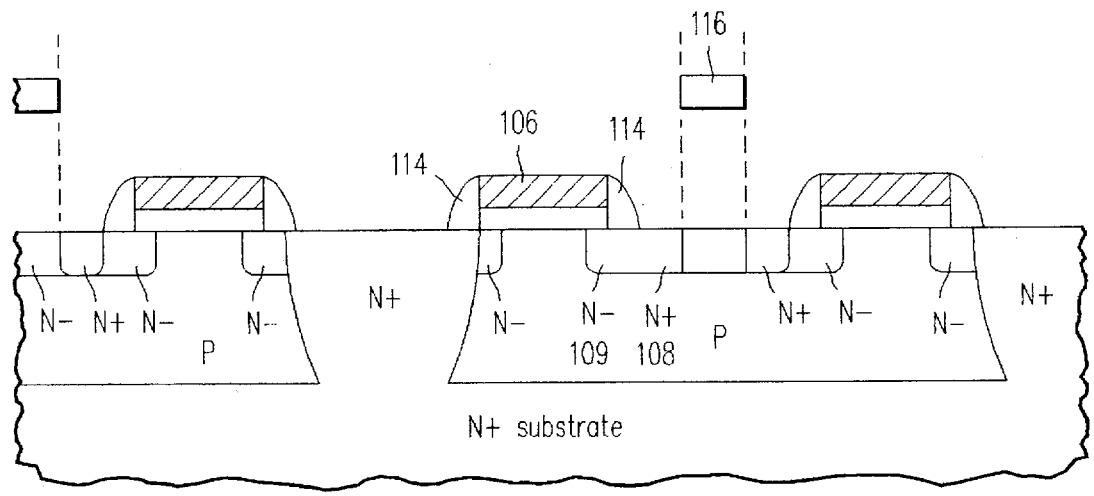

Next, a deep P+ body region is masked using an N+ blocking mask 116 represented in FIG. 6D as a rectangle. N type dopants (5E15 to 8E15 atoms/cm$^2$ dose) are then implanted to a relatively shallow depth of approximately 0.15–0.5 microns to form N+ type source region 108. The portion of N– type source region 113 which diffused laterally underneath gate 106 prior to the implanting of the N+ type source region 108 forms an N– type lightly doped source region 109. The width of the N+ blocking mask 116 is approximately 1.0–1.5 microns. The distance between the edge of the spacer 114 and the edge of the N+ blocking mask 116 which is implantable is approximately 1.0–1.5 microns. The resulting structure is shown in FIG. 6D.

Figure 6E:
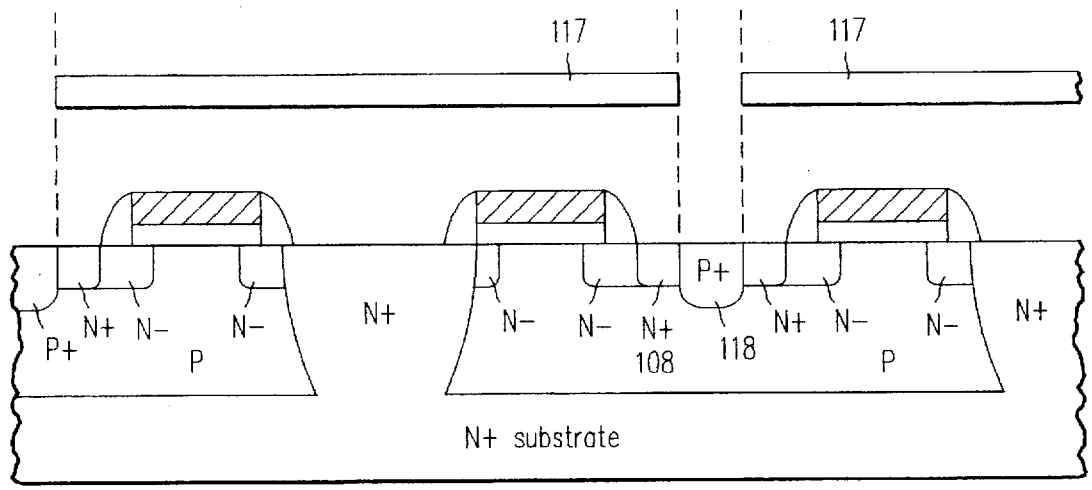

Next, the source region 108 is masked using a P+ blocking mask 117 represented in FIG. 6E as a rectangle. P type dopants are then implanted to a depth of approximately 0.5–0.7 microns to form deep P+ body region 118. The resulting structure is shown in FIG. 6E.

Next, a layer of BPSG oxide is blanket deposited over the entire surface, a contact mask is used to open a contact region down to the source region 108 and the deep P+ body region 118 at upper epitaxial silicon surface 104. BPSG layer 119 therefore covers gate 106 and spacers 114. Metal source electrode 107 is then formed. Metal drain electrode 100 is then formed on the bottom surface 101 of the substrate 102. Passivation (not shown) is then deposited over the top surface of the structure and pad openings (not shown) are formed through the passivation using a mask pad. FIG. 5 is a simplified cross-sectional diagram of the resulting structure.

Figure 7:
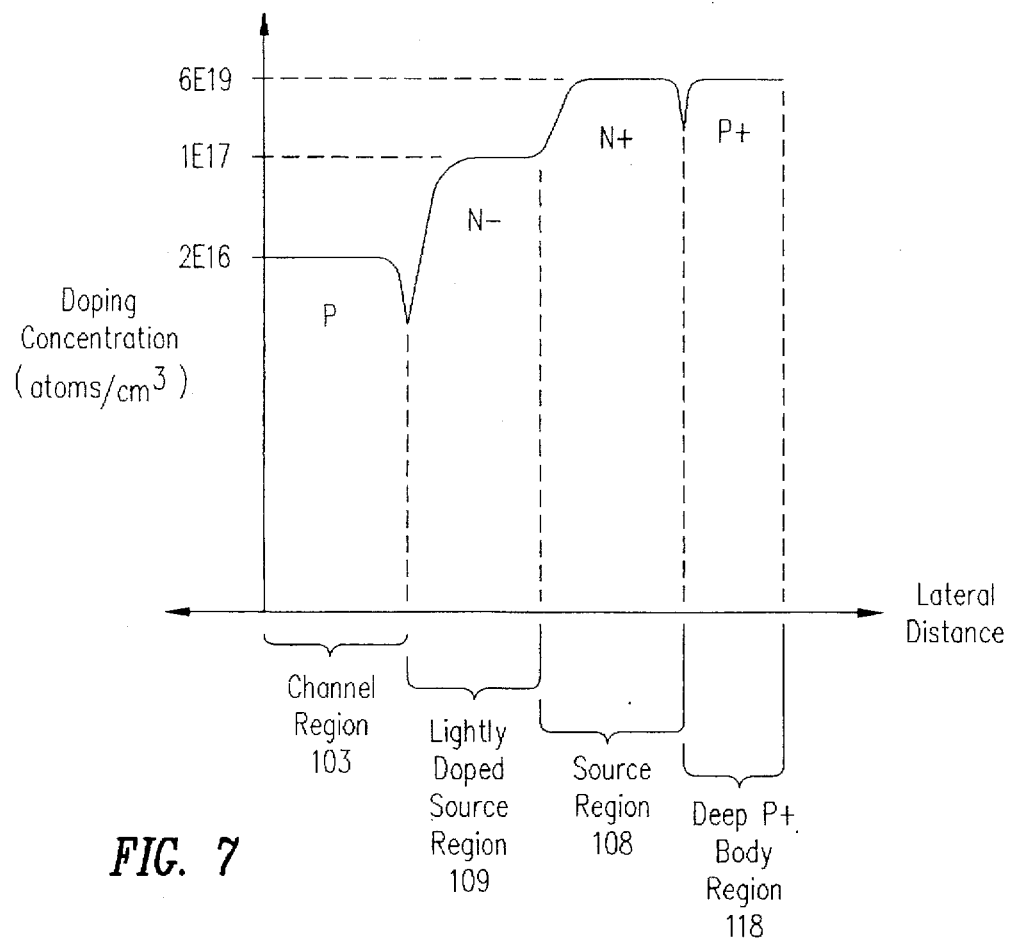
FIG. 7 illustrates a dopant profile for the structure of FIG. 5.

FIG. 7 illustrates a dopant profile for the structure of FIG. 5 taken along the upper surface 104 from channel region 103 to deep P+ body region 118. This transistor structure is envisioned to be especially useful in applications requiring threshold voltages below 1.0 volts with breakdown voltage requirements in the 20–30 volt range.

Figure 8:
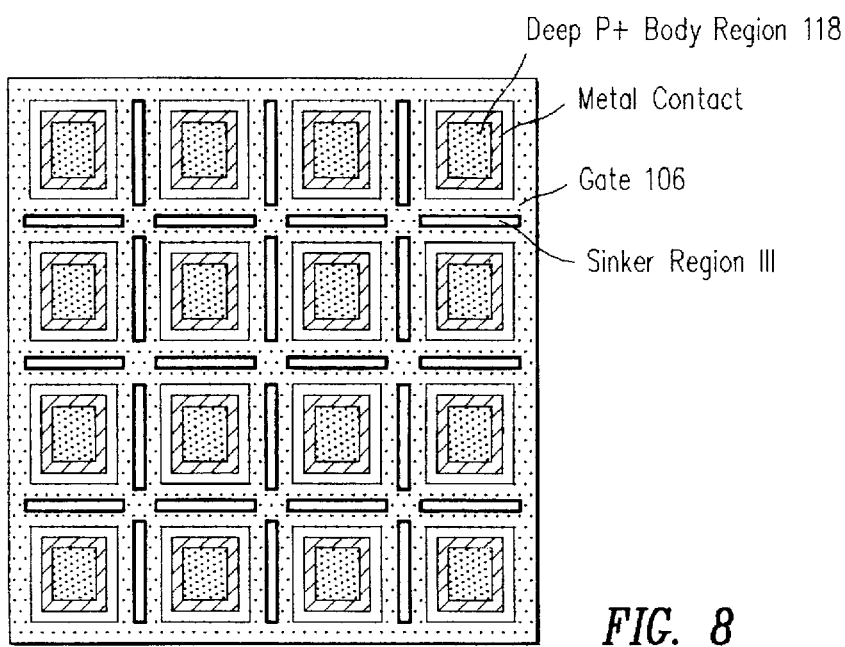
FIG. 8 is a top down diagram of one possible layout of the transistor structure of FIG. 5.

FIG. 8 is a top down diagram of one possible layout of the transistor structure of FIG. 5 using square cells. The pads are omitted from FIG. 8 for clarity of illustration. Other cell layouts, including layouts having strip-like elongated source electrodes, are possible.

Although certain exemplary specific embodiments have been described in order to illustrate the invention, the invention is not limited to the specific embodiments. Intervening layers and regions may be provided in some embodiments. Concentrations and dimensions may be varied. Dopant types may be of opposite types (complementary) to those shown here. Both N-channel and P-channel devices may be realized. In some embodiments, lightly doped source and drain regions are not provided. Accordingly, various modifications, adaptations and combinations of selected features of the specific embodiments are within the scope of the present invention as set forth in the appended claims.

What is claimed is:

1. A method of forming a transistor, comprising the steps of:

forming a P type epitaxial silicon layer over an N type substrate layer;

forming a gate over an upper surface of said epitaxial silicon layer;

forming an N type sinker region from said upper surface of said epitaxial silicon layer downward to said substrate layer;

implanting and diffusing, in only one diffusion step, a lightly-doped N type source region and a lightly-doped N type drain region into said epitaxial silicon layer to a depth and width less than that of said epitaxial silicon layer, wherein said lightly-doped N type source region is laterally spaced apart from said lightly-doped N type drain region; and forming a drain electrode on a bottom surface of said substrate layer, thereby forming part of a conductive path from said source region to said drain electrode when said transistor is turned on.

2. The method of claim 1, further comprising the step of forming an N type source region, more highly doped than said lightly-doped N type source region, in said lightly-doped N type source region, wherein said lightly-doped N type source region extends under said gate and said more highly-doped N type source region does not extend under said gate.

3. The method of claim 2, wherein the step of forming said more highly-doped N type source region comprises the steps of:

forming an oxide or nitride spacer on a lateral surface of said gate; and implanting said more highly-doped N type source region, so as to be laterally defined by said spacer.

4. A method of forming a transistor, comprising the steps of:

forming an N type epitaxial silicon layer over a P type substrate layer;

forming a gate over an upper surface of said epitaxial silicon layer;

forming a P type sinker region from said upper surface of said epitaxial silicon layer downward to said substrate layer;

implanting and diffusing, in only one diffusion step, a lightly-doped P type source region and a lightly-doped P type drain region into said epitaxial silicon layer to a depth and width less than that of said epitaxial silicon layer, wherein said lightly-doped P type source region is laterally spaced apart from said lightly-doped P type drain region; and forming a drain electrode on a bottom surface of said substrate layer, thereby forming part of a conductive path from said source region to said drain electrode when said transistor is turned on.

5. The method of claim 4, further comprising the step of forming a P type source region, more highly doped than said lightly-doped P type source region, in said lightly-doped P type source region, wherein said lightly-doped P type source region extends under said gate and said more highly-doped P type source region does not extend under said gate.

6. The method of claim 5, wherein the step of forming said more highly-doped P type source region comprises the steps of:

forming an oxide or nitride spacer on a lateral surface of said gate; and implanting said more highly-doped P type source region, so as to be laterally defined by said spacer.

* * * * *